United States Patent
Suehiro et al.

(10) Patent No.: US 6,943,379 B2
(45) Date of Patent: Sep. 13, 2005

(54) LIGHT EMITTING DIODE

(75) Inventors: Yoshinobu Suehiro, Aichi-ken (JP);
Hitomi Kawano, Aichi-ken (JP);
Tatsuya Takashima, Aichi-ken (JP);
Yuji Takahashi, Aichi-ken (JP); Atsuo Hirano, Aichi-ken (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 10/394,589

(22) Filed: Mar. 24, 2003

(65) Prior Publication Data

US 2003/0230757 A1 Dec. 18, 2003

(30) Foreign Application Priority Data

Apr. 4, 2002 (JP) ........................................ 2002-102665
Aug. 23, 2002 (JP) ........................................ 2002-244303

(51) Int. Cl.[7] ............................................. H01L 29/22
(52) U.S. Cl. .................... 257/99; 257/100; 257/101; 257/102; 257/678
(58) Field of Search .................... 257/99–104, 678; 438/22, 37

(56) References Cited

U.S. PATENT DOCUMENTS 6,469,322 B1 * 10/2002 Srivastava et al. ............ 257/89
6,509,651 B1 * 1/2003 Matsubara et al. ......... 257/461
2001/0002049 A1 * 5/2001 Reeh et al. .................. 257/103
2001/0024087 A1 9/2001 Suehiro et al.
2003/0160259 A1 * 8/2003 Uemura ....................... 257/99

FOREIGN PATENT DOCUMENTS

JP 2947344 7/1999
JP 2001-217466 8/2001

* cited by examiner

*Primary Examiner*—Hoai Pham
*Assistant Examiner*—Nathan W. Ha
(74) *Attorney, Agent, or Firm*—McGinn & Gibb, PLLC

(57) ABSTRACT

In a light emitting diode, a blue light emitting element is mounted on a base having a cup through a phosphor-containing mount so that the light emitting element is located within the cup and is mounted on the bottom of the cup through the phosphor-containing mount. The light emitting diode includes a light emitting element and a p electrode. By virtue of the above construction, blue light emitted from the light emitting element can be reflected from the lower surface of the p electrode without being radiated directly from the upper surface of the light emitting element to the outside of the light emitting diode. As a result, the blue light emitted from the light emitting element can be efficiently mixed with yellow light given off from the phosphor in the phosphor-containing mount to provide white light which is radiated to the outside of the light emitting diode with high efficiency. The white light can be perceived by a viewer to be uniformly radiated from the light radiating surface of the light emitting diode.

24 Claims, 7 Drawing Sheets

REFLECTION LIGHT EMITTING DIODE 51
53C CENTER PAD
56 REFLECTOR

CONVENTIONAL REFLECTION LIGHT EMITTING DIODE 103
CENTER PAD
102c 102 LIGHT SOURCE
104 REFLECTOR

| SMALL | INFLUENCE OF CENTER PAD | LARGE |
| SMALL | SPREADING OF BEAM DERIVED FROM LIGHT SOURCE SIZE | LARGE |

68 LIGHT EMITTING DIODE
69 TRANSPARENT EPOXY RESIN
WIRE 64
64 WIRE
62, LIGHT EMITTING ELEMENT
65 PHOSPHOR-MIXED MATERIAL
LEAD 60b
60a LEAD

LIGHT EMITTING DIODE

The present application is based on Japanese Patent Applications No. 2002-102665 and No. 2002-244303, the entire contents of which are incorporated herein by reference.

BACKGROUND OF THE INVENTION

1. Field of the Invention

The invention relates to a light emitting diode including a light emitting element and a phosphor. More particularly, the invention is concerned with a light emitting diode including a light emitting element and a phosphor in which light of a predetermined color emitted from the light emitting element is mixed with photoluminescence given off from the phosphor to provide light having a mixed color which is then radiated to the outside of the light emitting diode. In this specification, an LED chip per se is referred to as "light emitting element," and the whole system including an LED chip-mounted package resin or lens system or other optical system is referred to as "light emitting diode."

2. Related Art

Light emitting elements, which are generally used in light emitting diodes, include inorganic light emitting elements, laser diodes, inorganic thick film electroluminescence sheets, and inorganic thin film electroluminescence components. Among others, inorganic light emitting elements have outstanding features including long service life, space saving, good impact resistance, and narrow-band emission spectrum.

A large number of emission colors, particularly a large number of emission colors with broad-band emission spectrum cannot be realized by light emission inherent in active semiconductor materials in inorganic light emitting elements, or can be realized only with low efficiency. In particular, this is true of the provision of white light emission.

Emission colors which cannot be realized by semiconductors have hitherto been provided by a wavelength conversion technique. The wavelength conversion technique is essentially based on the following principle. Specifically, at least one phosphor is placed on a light emitting element, and the phosphor absorbs light emitted from the light emitting element and gives off light with a wavelength different from the absorbed light. In other words, the phosphor absorbs light emitted from the light emitting element and then radiates photoluminescence with a different emission color.

A light emitting diode, which emits light based on the above principle, is described in Japanese Patent No. 2947344. This light emitting diode is shown in FIG. 1. As can be seen from FIG. 1, the light emitting diode includes a pair of lead frames 113, 114. A cup part 116, which functions as a reflector, is provided in the lead frame 113. A blue light emitting element 102 is fixed to the cup part 116 with the aid of a phosphor-containing adhesive 110. The blue light emitting element 102 is provided with a pair of electrodes 102a, 102b. The electrode 102a is connected to the corresponding lead frame 113 through a bonding wire 105, and the electrode 102b is connected to the corresponding lead frame 114 through a bonding wire 106. The whole assembly has been sealed with a light transparent resin 108.

In this light emitting diode, blue light emitted from the blue light emitting element 102 is partially or entirely subjected to wavelength conversion by the phosphor. As a result, light with a color different from blue light is radiated.

For example, when a yellow phosphor is used, yellow light obtained by the wavelength conversion is mixed with blue light not subjected to wavelength conversion to provide a mixed light which is then radiated to the outside of the light emitting diode. Therefore, this mixed light is theoretically seen as white light as viewed from the outside of the light emitting diode.

A reflection light emitting diode may be mentioned as another conventional light emitting diode using a combination of a light emitting element with a phosphor. This reflection light emitting diode is shown in FIGS. 2 and 3.

In this light emitting diode, as shown in FIG. 2, a light emitting body 120 is used in which a light emitting element 102 is mounted on the bottom of a concave 121 and the concave is filled with a phosphor-mixed resin 122. Specifically, as shown in FIG. 3, the blue light emitting element 102 is mounted on the bottom of the concave 121 so as for the light emitting surface of the blue light emitting element 102 to face downward, and the concave 121 with the blue light emitting element 102 mounted therein is filled with the phosphor-mixed resin 122. This light emitting body 120 is used as a light source. A reflector 124 in the form of paraboloid of revolution of which the focal point is the light emitting element 102 is disposed opposite to the light source, and the whole assembly is sealed with a transparent epoxy resin 125.

The light emitting diode shown in FIG. 1 and the reflection light emitting diode shown in FIGS. 2 and 3, however, have the following problems.

In the case of the light emitting diode shown in FIG. 1, the quantity of light emitted from the upper surface of the blue light emitting element is larger than the quantity of blue light emitted from the side or lower part of the blue light emitting element. On the other hand, since the layer thickness of the phosphor is relatively small, the quantity of light absorbed in the phosphor layer is small. Due to these facts, the quantity of yellow light emitted is unsatisfactory. For this reason, when the upside of the blue light emitting diode is viewed from the outside of the diode, the emission color perceived by the viewer is not a contemplated color, that is, is not white. Specifically, the emission color of the center portion is perceived by the viewer to be somewhat bluish, and the emission color around the center portion is perceived by the viewer to be somewhat yellowish. Thus, the light emitting diode shown in FIG. 1 is disadvantageous in that a desired color such as white color cannot be uniformly emitted from the whole light radiating surface of the light emitting diode.

On the other hand, in the reflection light emitting diode 123 shown in FIGS. 2 and 3, the whole concave 121 emits light. Therefore, the size of the light source is large, and this large light source size poses various problems. Specifically, when white light provided by mixing blue light with fluorescence has been applied downward from this light source, the white light should be reflected substantially perpendicularly from the reflector 124 and radiated upward. However, this cannot be achieved by the following problems: (i) the size of the concave 121 constituting the light source is so large that light reflected from a portion around the center of the reflector 124 is blocked by the concave 121 and cannot be radiated outside the light emitting diode; and (ii) since the diameter of the light source is large, the light beam is spread and consequently is disadvantageously reflected obliquely from the reflector 124 and cannot be radiated in a substantially perpendicular direction. Further, the reflection light emitting diode shown in FIGS. 2 and 3 has an additional problem (iii) that, because of the large original light source, white light, which has been radiated outside the light emitting diode, cannot be focused to a small size by a focusing optical system.

Additionally, coating of the phosphor-mixed resin 126 onto only a portion around the light emitting element 102 to provide white light as shown in FIG. 4 is considered. In this method, however, the concentration of the phosphor in the resin should be increased, and the increased phosphor concentration causes light emitted from the light emitting element 102 to be absorbed and attenuated in the phosphor-mixed resin 126. This disadvantageously poses a problem of low fluorescence excitation efficiency.

SUMMARY OF THE INVENTION

Under these circumstances, the invention has been made, and it is an object of the invention to provide a light emitting diode which can radiate light having a desired color, such as white, uniformly from the whole light radiating surface.

It is another object of the invention to provide a light emitting diode which can exhibit desired performance in a light source size substantially equal to the size of the light emitting element and can enhance phosphor excitation efficiency.

According to the first feature of the invention, a light emitting diode comprises:

a base;

a light emitting element formed of a compound semiconductor provided on the base;

a mount which is provided between the base and the light emitting element to bond the base to the light emitting element, said mount containing therein a phosphor which absorbs light emitted from the light emitting element and gives off light with a wavelength different from the absorbed light; and a light nontransparent conductive layer which is provided in its emitted light viewing surface side and reflects the light emitted from a light emitting layer of the light emitting element toward the mount.

According to this construction, light emitted from the light emitting element is reflected from the light nontransparent conductive layer and thus does not directly go to the emitted light viewing surface side. Further, the light emitted from the light emitting element, together with the light reflected from the conductive layer, is incident to and excites the phosphor in the mount. Light given off by the excitation of the phosphor and the unconverted light emitted from the light emitting element are reflected upward from the base and are radiated to the outside of the light emitting diode on its emitted light viewing surface side. Therefore, the light radiated from the light radiating surface of the light emitting diode is perceived by a viewer to be uniformly radiated from the whole light radiating surface of the light emitting diode. Thus, emission of light having a desired color such as white uniformly from the whole light radiating surface can be realized.

The conductive layer may be formed of a p electrode. In this case, the p electrode can have both a light reflecting function and a wire bonding function. The formation of the p electrode on the whole surface of a p-type layer in the light emitting element can improve reflection efficiency and, at the same time, can render wire bonding easier. Further, unlike the prior art technique, there is no need to additionally provide a pad electrode for wire bonding, and wire bonding directly to the p electrode is possible. This can simplify the production process.

According to the second feature of the invention, a light emitting diode comprises:

a base;

a light emitting element formed of a compound semiconductor provided on the base;

a mount which is provided between the base and the light emitting element to bond the base to the light emitting element, said mount containing therein a phosphor which absorbs light emitted from the light emitting element and gives off light with a wavelength different from the absorbed light; and a phosphor-mixed layer that is provided on the light emitting surface side and side surface of the light emitting element and contains a phosphor which absorbs light emitted from the light emitting element and gives off light with a wavelength different from the absorbed light.

According to this construction, a part of phosphor-originated light can be obtained by the phosphor contained in the mount. Therefore, a light source capable of emitting a desired color and having a size substantially equal to the size of the light emitting element can be provided without increasing the concentration of the phosphor in the phosphor-mixed layer to such a level that causes absorption and attenuation of the light emitted from the light emitting element. Thus, a light emitting diode can be realized in which the light source size is substantially equal to the size of the light emitting element and, at the same time, the efficiency of giving off fluorescence upon excitation can be enhanced.

In the invention, when a construction is adopted wherein the light emitting diode is used as a light source and a reflector is provided opposite to the light emitting element, since a light source size substantially equal to the size of the light emitting element is possible, the quantity of light, which is reflected from a portion around the center of the reflector and is blocked by the light source, is very small. Further, no light is reflected obliquely from the reflector, and the light can be reflected substantially parallel to the central axis of the reflector. Therefore, a reflection light emitting diode can be realized in which the efficiency of radiating light to the outside of the light emitting diode is high, light distribution can also be regulated, and light can be radiated substantially parallel to the central axis of the reflector.

Further, since a light source size substantially equal to the size of the light emitting element, that is, a small light source, can be realized, the radiated light can be focused to a small spot even when the sealing resin is of a lens type.

BRIEF DESCRIPTION OF THE DRAWINGS

The invention will be explained in more detail in conjunction with the appended drawings, wherein.

DESCRIPTION OF THE PREFERRED EMBODIMENTS

Preferred embodiments of the invention will be explained in detail in conjunction with the accompanying drawings.
(First Preferred Embodiment)

Figure 1:
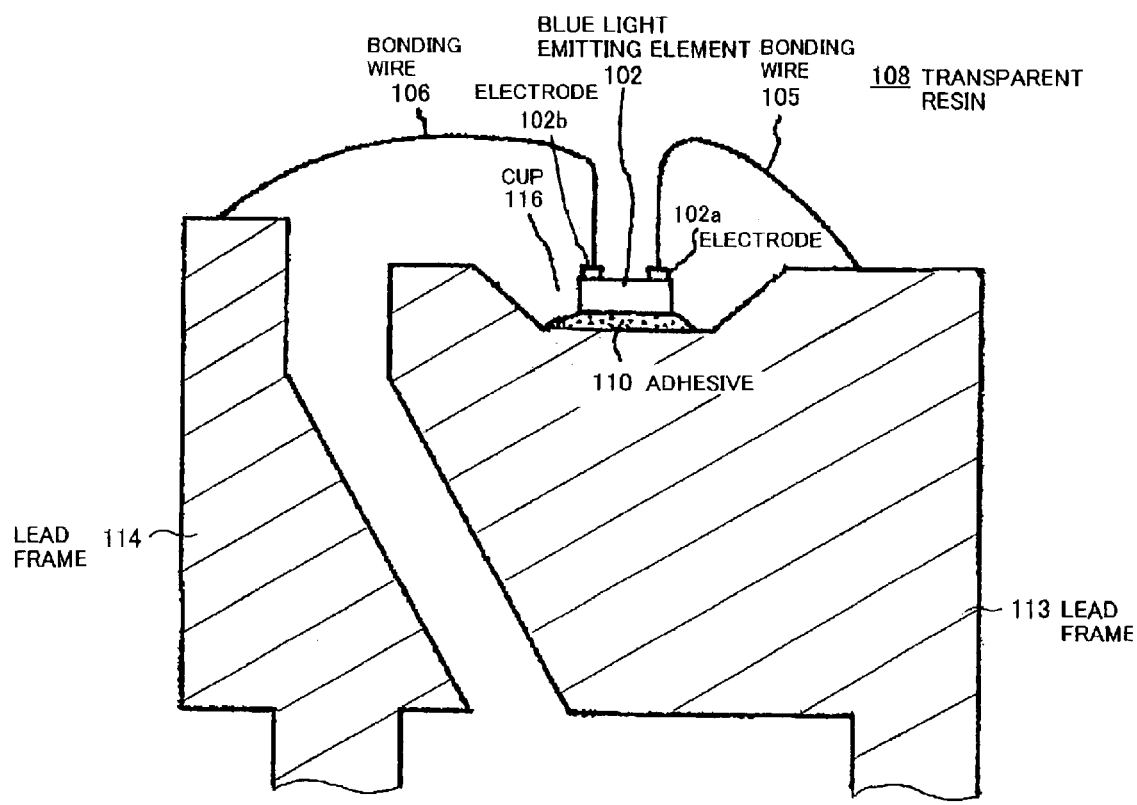
FIG. 1 is a longitudinal sectional view showing a conventional light emitting diode including a light emitting element and a phosphor.
Figure 2:
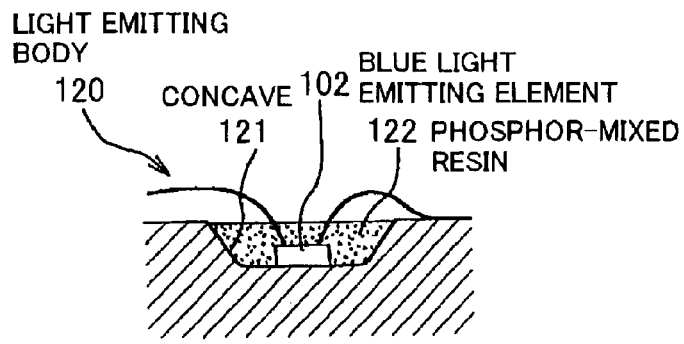
FIG. 2 is a longitudinal sectional view showing a light emitting body part of a conventional reflection light emitting diode including a light emitting element and a phosphor.
Figure 3:
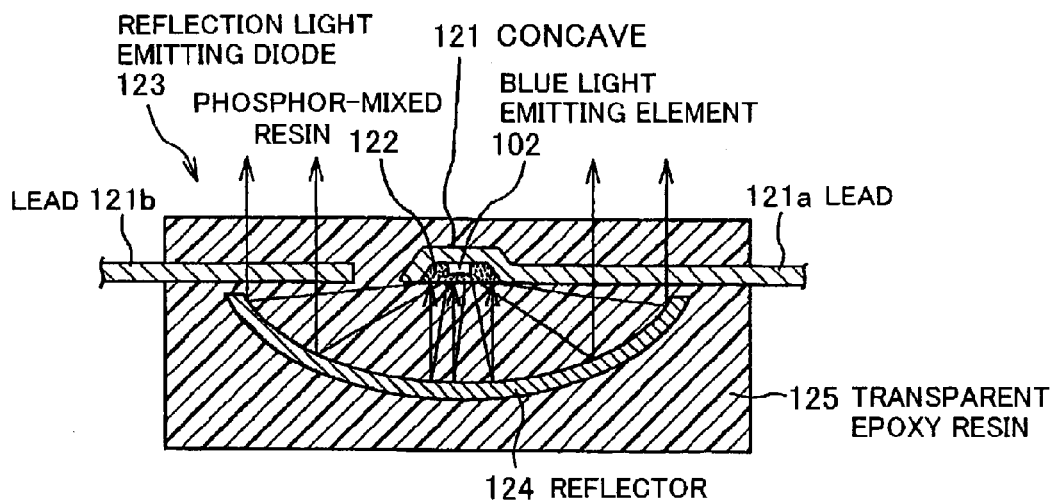
FIG. 3 is a longitudinal sectional view showing a conventional reflection light emitting diode including a light emitting element and a phosphor.
Figure 4:
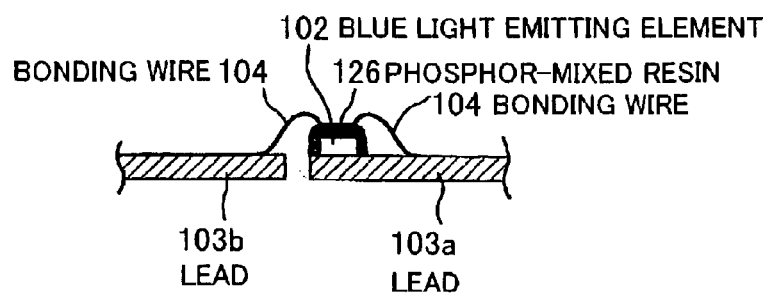
FIG. 4 is a longitudinal sectional view showing a conventional light emitting body including a light emitting element and a phosphor.
Figure 5:
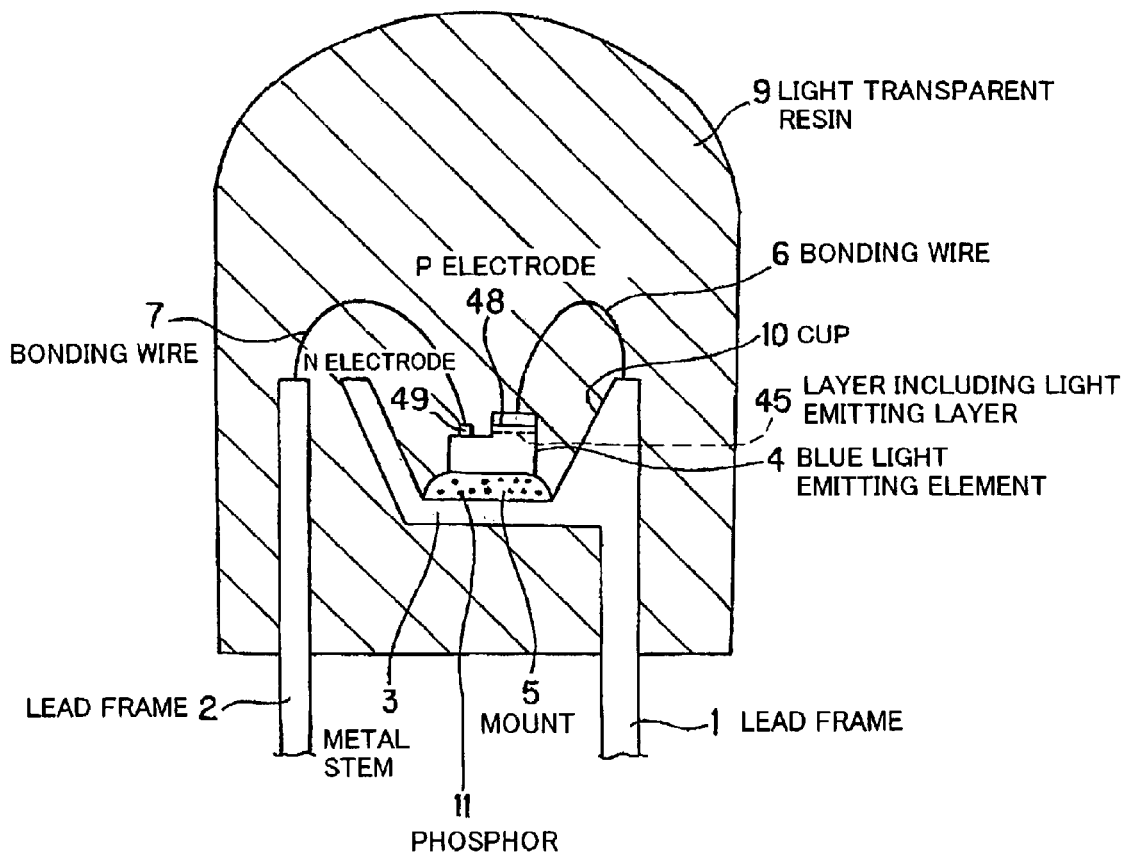
FIG. 5 is a cross-sectional view showing the construction of a lens-type light emitting diode in a first preferred embodiment of the invention.

FIG. 5 is a cross-sectional view showing the construction of the so-called "lens-type light emitting diode" in the first preferred embodiment of the invention. This light emitting diode includes a blue light emitting element 4 and lead frames 1, 2. A metal stem 3 provided with a cup 10 is extended from the lead frame 1. The blue light emitting element 4 is formed of a GaN-base semiconductor and is located in the cup 10 and is mounted on the metal stem 3 through a mount 5. The cup 10 functions as a reflector which reflects light emitted from the blue light emitting element 4 above the light emitting diode.

The p electrode 48 is a light nontransparent, light reflective, thick conductive metal layer. The p electrode 48 is electrically connected to the lead frame 1 through a gold bonding wire 6, and the n electrode 49 is electrically connected to the lead frame 2 through a gold bonding wire 7. The metal stem 3 and the lead frame 1 are often collectively referred to as a "mount lead." Further, the above constituent elements have been sealed with a light transparent resin 9. The light transparent resin 9 may be formed from a silicone or epoxy resin which becomes transparent upon curing.

The light emitting diode in this preferred embodiment is characterized in that the p electrode 48 is a thick layer of a light nontransparent, light reflective conductive metal and that a phosphor 11 has been incorporated in the mount 5. According to this preferred embodiment, light emitted from the layer 45 including a light emitting layer in the blue light emitting element 4 is not transmitted above the blue light emitting element 4 and is reflected downward from a lower surface 48a of the p electrode 48 to the mount 5 side. Therefore, the emitted light is mostly incident to the mount 5, and this incident light, together with wavelength converted light given off by the phosphor 11, is reflected upward from the cup 10.

The light emitting diode in this preferred embodiment will be explained in more detail in conjunction with FIG. 6.

Figure 6:
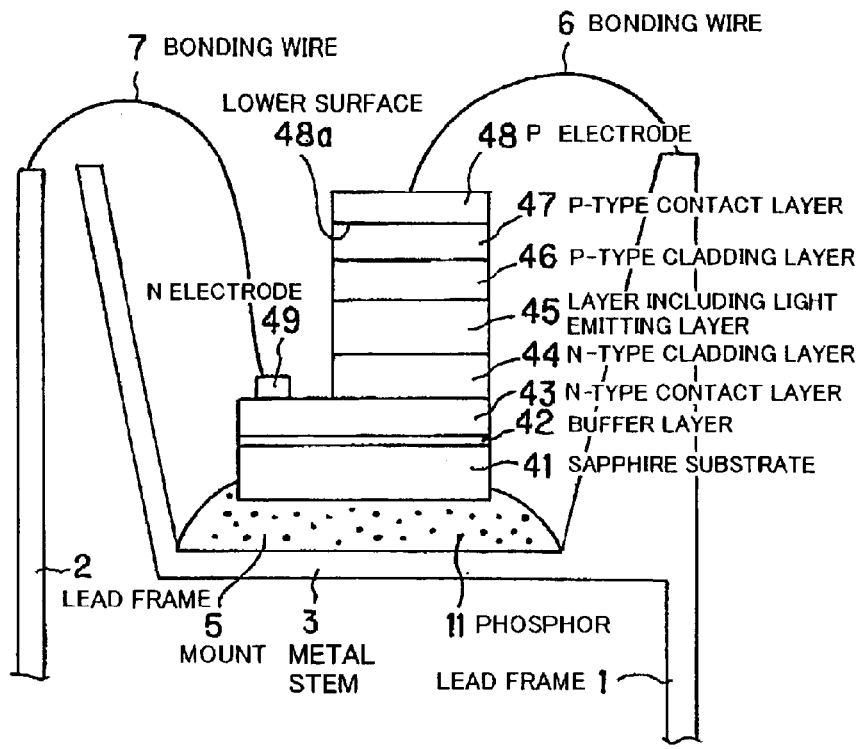
FIG. 6 is an enlarged cross-sectional view showing a characteristic part of the lens-type light emitting diode in the first preferred embodiment of the invention.

FIG. 6 is an enlarged cross-sectional view showing a characteristic part of the lens-type light emitting diode in the first preferred embodiment of the invention. As shown in FIG. 6, this structure includes, for example, a sapphire substrate 41 as a transparent substrate. For example, a buffer layer 42, an n-type contact layer 43, an n-type cladding layer 44, a layer 45 including a light emitting layer, a p-type cladding layer 46, and a p-type contact layer 47 are formed as nitride semiconductor layers, for example, by MOCVD (metal-organics chemical vapor deposition) in that order on the sapphire substrate 41. A p electrode 48 is formed as a thick layer of a light nontransparent, light reflective conductive metal on the whole surface of the p-type contact layer 47, for example, by sputtering or vacuum deposition. Further, an n electrode 49 is formed on a part of the n-type contact layer 43. Materials for the p electrode usable herein include metals, such as rhodium (Rh), gold (Au), platinum (Pt), silver (Ag), copper (Cu), aluminum (Al), nickel (Ni), cobalt (Co), magnesium (Mg), palladium (Pd), vanadium (V), manganese (Mn), bismuth (Bi), tin (Sn), and rhenium (Re), or alloys of the above metals. Among them, rhodium and platinum can highly reflect emission wavelength of a blue light emitting element formed of a GaN-base semiconductor and thus can be used as a suitable p electrode material. The p electrode may have a two-layer or multilayer structure of a laminate of two or more layers different from each other or one another in composition. Materials for the n electrode usable herein include metals, such as aluminum, vanadium, tin, titanium (Ti), chromium (Cr), niobium (Nb), tantalum (Ta), molybdenum (Mo), tungsten (W), and hafnium (Hf), or alloys of these metals. The n electrode may have a two-layer or multilayer structure of a laminate of two or more layers different from each other or one another in composition. For example, a two-layer structure of a vanadium layer and an aluminum layer may be adopted.

The buffer layer 42 may be formed of, for example, AlN, and the n-type contact layer 43 may be formed of, for example, GaN.

The n-type cladding layer 44 may be formed of, for example, $Al_yGa_{1-y}N$ ($0 \leq y < 1$). The p-type cladding layer 46 may be formed of, for example, $Al_xGa_{1-x}N$ ($0 < x < 1$). The p-type contact layer 47 may be formed of, for example, $Al_zGa_{1-z}N$ ($0 \leq z < 1$, $z < x$). The bandgap of the p-type cladding layer 46 is preferably larger than that of the n-type cladding layer 44. The n-type cladding layer 44 and the p-type cladding layer 46 may have a construction of a single composition, or alternatively may have a construction of a laminate of nitride semiconductor layers which are different from each other or one another in composition and have a thickness of not more than 100 angstroms so as to constitute a superlattice structure. When the layer thickness is not more than 100 angstroms, the occurrence of cracks and crystal defects in the layer can be prevented.

The layer 45 including a light emitting layer may comprise a plurality of well layers of InGaN and a plurality of barrier layers of GaN. The thickness of the well layer and the thickness of the barrier layer may be not more than 100 angstroms, preferably 60 to 70 angstroms, from the viewpoint of forming a superlattice layer. In respect of the characteristics of crystal, InGaN is softer than aluminum-containing nitride semiconductors such as AlGaN. Therefore, when InGaN is used in the layer constituting the layer 45 including a light emitting layer, cracking is less likely to occur in the whole of each of the stacked nitride semiconductor layers. The layer 45 including a light emitting layer may comprise a plurality of well layers of InGaN and a plurality of barrier layers of AlGaN. Alternatively, the layer 45 including a light emitting layer may comprise a plurality of well layers of AlInGaN and a plurality of barrier layers of AlInGaN. The bandgap energy of the barrier layer is made larger than that of the well layer.

The half bandwidth of the emission wavelength of the blue light emitting element 4 having the above construction may be not more than 50 nm, preferably not more than 40 nm. The peak emission wavelength of the blue light emitting element 4 may fall within the range of 380 nm to 500 nm, for example, 450 nm.

The mount 5 may be formed of various transparent resins, such as epoxy resin, from the viewpoint of handleability. Preferably, the resin used in the mount 5 has adhesive properties and, at the same time, has insulating properties. Insulating properties possessed by the mount 5 are advantageous in that, even when the mount 5 is present also on the side face of the very small blue light emitting element 4, short-circuiting between layers constituting the blue light emitting element 4 on the side face of the blue light emitting element 4 can be avoided.

The phosphor 11 contained in the mount 5 is preferably a yttrium-aluminum-garnet-base phosphor such as a Ce:YAG (cerium-doped yttrium-aluminum-garnet) phosphor.

In the light emitting diode having the above construction, upon the application of voltage across the lead frames 1, 2, for example, blue light with wavelength 450 to 480 nm is emitted from the layer 45 including a light emitting layer. In this case, in the blue light emitting element 4, the light emitted from the layer 45 including a light emitting layer is reflected downward from the lower surface 48a of the p electrode 48 to the mount 5 side. Therefore, the emitted light is mostly incident to the mount 5 to excite the phosphor 11. The excited phosphor 11 gives off, for example, yellow light with wavelength 550 to 580 nm. A part of the blue light emitted from the layer 45 including a light emitting layer does not enter the phosphor 11 and as such is transmitted through the mount 5. The transmitted blue light, together with the yellow light, reflected upward from the cup 10 is transmitted through the light transparent resin 9.

During the transmission of these lights through the light transparent resin 9, the upward reflected blue light and yellow light are mixed together within the light transparent resin 9, and the mixed light is passed through the light transparent resin 9 and is radiated to the outside of the light emitting diode. Therefore, the mixed light is perceived by the human's eye as white light. As a result, the light emitting diode is perceived by the viewer as emitting white light.

In this case, unlike the conventional light emitting diode, blue light is not emitted directly from the upper surface of the blue light emitting element 4. Therefore, the occurrence of such an unfavorable phenomenon, experienced by the conventional light emitting diode, that the upper part of the blue light emitting element is seen to be bluish, can be avoided. That is, in the invention, the blue light is not radiated directly from the upper surface of the blue light emitting element 4, and the blue light and the yellow light are reflected upward from the cup 10 and are radiated to the outside of the light emitting diode. Therefore, the whole light radiating surface of the light emitting diode is perceived by a viewer as uniformly emitting white light. Thus, uniform emission of white light from the whole light radiating surface can be realized.

In one type of a conventional light emitting diode, after filling the inside of the cup 10 as shown in FIG. 5 with a sealing agent, a resin corresponding to the light transparent resin 9 is externally provided. Unlike this type of the conventional light emitting diode, in the light emitting diode in the first preferred embodiment, the step of filling the inside of the cup 10 with the sealing agent is unnecessary. Therefore, this can simplify the production process and can contribute to a lowering in production cost.

(Second Preferred Embodiment)

Figure 7:
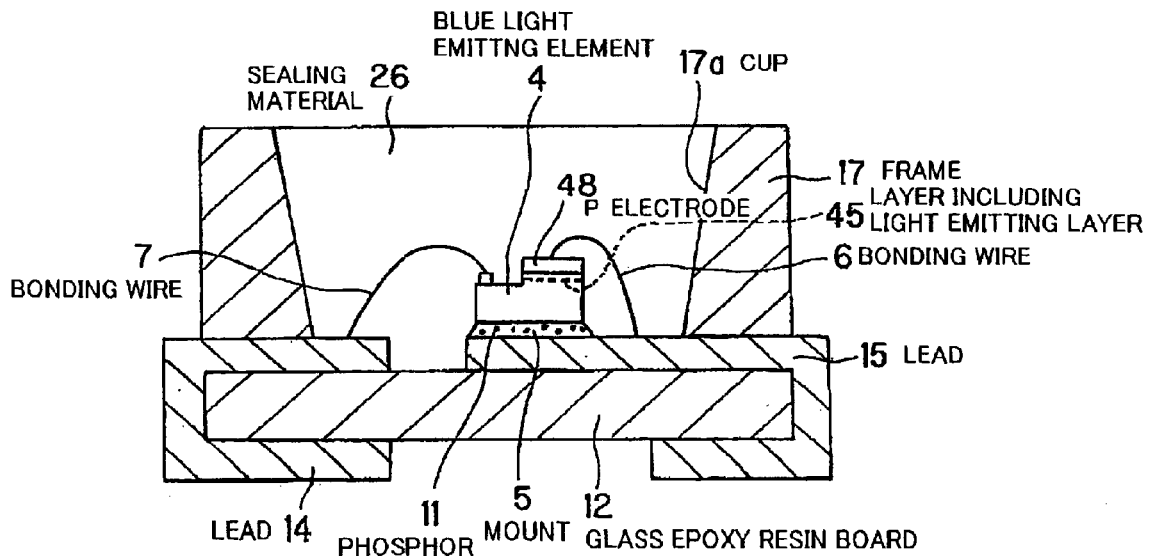
FIG. 7 is a cross-sectional view showing the construction of an SMD-type (surface mounted device-type) light emitting diode in a second preferred embodiment of the invention.

A light emitting diode in a second preferred embodiment of the invention will be explained in conjunction with FIG. 7. In FIGS. 7 and 5, like parts are identified with the same reference characters, and the overlapped explanation thereof will be omitted.

The light emitting diode shown in FIG. 7 is of SMD (surface mounted device) type and has the following construction. Two leads 14, 15, which are formed of a gold pattern and are electrically insulated from each other, are provided on the upper and lower sides of an insulating glass-epoxy resin board 12. A frame 17 provided with a plastic cup 17a is provided on the leads 14, 15. The inner surface of the cup 17a functions as a reflector which reflects light emitted from the blue light emitting element 4. The leads 14, 15 are asymmetrical with respect to each other. The upper surface of the lead 15 extends to the center portion of the bottom of a space provided by the cup 17a in the frame 17. On the other hand, the other lead, the lead 14, is provided so as to be slightly exposed on the bottom of the space.

The blue light emitting element 4 is fixed onto the upper surface of the lead 15 through a mount 5. The p electrode 48 is connected to the lead 15 through a gold bonding wire 6. The n electrode 49 is connected to the lead 14 through a gold bonding wire 7.

A space defined by the cup 17a of the frame 17 is filled with a sealing agent 26 produced from a material which becomes transparent upon curing. The blue light emitting element 4 is fixed by this sealing agent 26. As the sealing agent 26, a silicone resin or an epoxy resin may be used. The space defined by the cup 17a of the frame 17 may be fully filled with the sealing agent 26. Alternatively, the space defined by the cup 17a may not be fully filled with the sealing agent 26, and a certain level of space from the upper edge of the frame 17 may remain unfilled so far as this does not adversely affect the radiation of the white light.

In the light emitting diode having the above construction, upon the application of voltage across the leads 14, 15, for example, blue light with wavelength 450 to 480 nm is emitted from the layer 45 including a light emitting layer. In this case, in the blue light emitting element 4, the light emitted from the layer 45 including a light emitting layer is reflected downward from the lower surface 48a of the p electrode 48 to the mount 5 side. Therefore, the emitted light is mostly incident to the mount 5 to excite the phosphor 11. The excited phosphor 11 gives off, for example, yellow light with wavelength 550 to 580 nm. A part of the blue light emitted from the layer 45 including a light emitting layer does not enter the phosphor 11 and as such is transmitted through the mount 5. The transmitted blue light, together with the yellow light, reflected upward from the cup 17a is transmitted through the sealing agent 26.

During the transmission of these lights through the sealing agent 26, the upward reflected blue light and yellow light are mixed together within the sealing agent 26, and the mixed light is passed through the sealing agent 26 and is radiated to the outside of the light emitting diode. Therefore, the mixed light is perceived by the human's eye as white light. As a result, the light emitting diode is perceived by the viewer as emitting white light.

In this case, unlike the conventional light emitting diode, blue light is not emitted directly from the upper surface of the blue light emitting element 4. Therefore, the occurrence of such an unfavorable phenomenon, experienced by the conventional light emitting diode, that the upper part of the blue light emitting element is seen to be bluish, can be avoided. That is, in the invention, the blue light is not emitted directly from the upper surface of the blue light emitting element 4, and the blue light and the yellow light are reflected upward from the cup 17*a* and are radiated to the outside of the light emitting diode. Therefore, the whole light radiating surface of the light emitting diode is perceived by a viewer as uniformly emitting white light. Thus, uniform emission of white light from the whole light radiating surface can be realized.

In this preferred embodiment, the phosphor 11 capable of giving off yellow light upon excitation with the blue light is used. Alternatively, a mixture composed of a phosphor capable of giving off green light upon excitation with blue light and a phosphor capable of giving off red light upon excitation with blue light may be used instead of the phosphor 11. Further, a construction may also be adopted wherein a light emitting element capable of emitting near-ultraviolet light is used instead of the blue light emitting element and, at the same time, a mixture composed of a phosphor capable of giving off blue light upon excitation with near-ultraviolet light, a phosphor capable of giving off green light upon excitation with near-ultraviolet light, and a phosphor capable of giving off red light upon excitation with near-ultraviolet light is used instead of the phosphor 11.

(Third Preferred Embodiment)

The light emitting diode in the third preferred embodiment of the invention will be explained in conjunction with FIGS. 8, 9, 10, 11A, and 11B.

Figure 8:
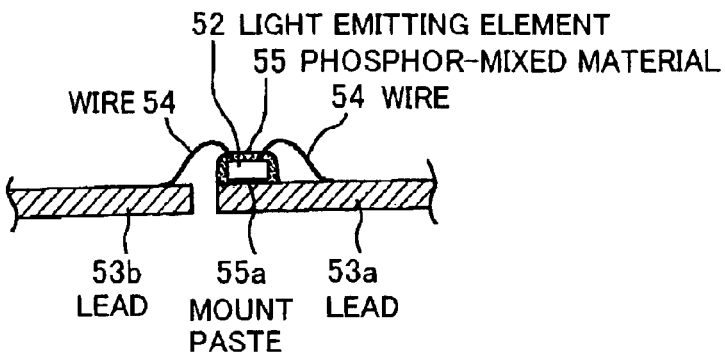
FIG. 8 is a longitudinal sectional view showing a light source part of a reflection light emitting diode in a third preferred embodiment of the invention.

At the outset, a light source part of a reflection light emitting diode in the third preferred embodiment of the invention will be explained in conjunction with FIG. 8. As shown in FIG. 8, the light source part of the reflection light emitting diode in the third preferred embodiment includes a blue light emitting element (hereinafter referred to simply as "light emitting element") 52. A pair of leads 53*a*, 53*b* are provided for supplying electric power to the light emitting element 52. The light emitting element 52 is mounted onto the leading end of the lead 53*a*. In this case, a mount paste 55*a* with a phosphor incorporated therein is interposed between the light emitting element 52 and the lead 53*a*. A phosphor-mixed material 55 is also coated onto the upper surface and side face of the light emitting element 52. The light emitting element 52 is electrically connected to the lead 53*a* through a wire 54, and the light emitting element 52 is electrically connected to the lead 53*b* through another wire 54. The concentration of the phosphor in the mount paste 55*a* provided on the bottom of the light emitting element 52 is larger than the concentration of the phosphor in the phosphor-mixed material 55.

Upon the supply of electric power from an external power supply to the light emitting element 52 in the light source part having the above construction through the pair of leads 53*a*, 53*b*, blue light is emitted from the light emitting element 52. The phosphor contained in the mount paste 55*a* located on the underside of the light emitting element 52 and the phosphor contained in the phosphor-mixed material 55 located on the upper surface and side surface of the light emitting element 52 are excited by this blue light to give off yellow fluorescence. Since a part of the phosphor-originated light is obtained from the phosphor contained in the mount paste 55*a* interposed between the light emitting element 52 and the lead 53*a*, a white light source having a size substantially equal to the size of the light emitting element can be realized without increasing the concentration of the phosphor in the phosphor-mixed material 55 provided on the upper surface of the light emitting element 52 to such a level that deteriorates the fluorescence excitation efficiency. A high concentration of the phosphor in the mount paste 55*a* can increase light takeout efficiency by virtue of reflection from the surface of the phosphor in the mount paste 55*a*.

Figure 9:
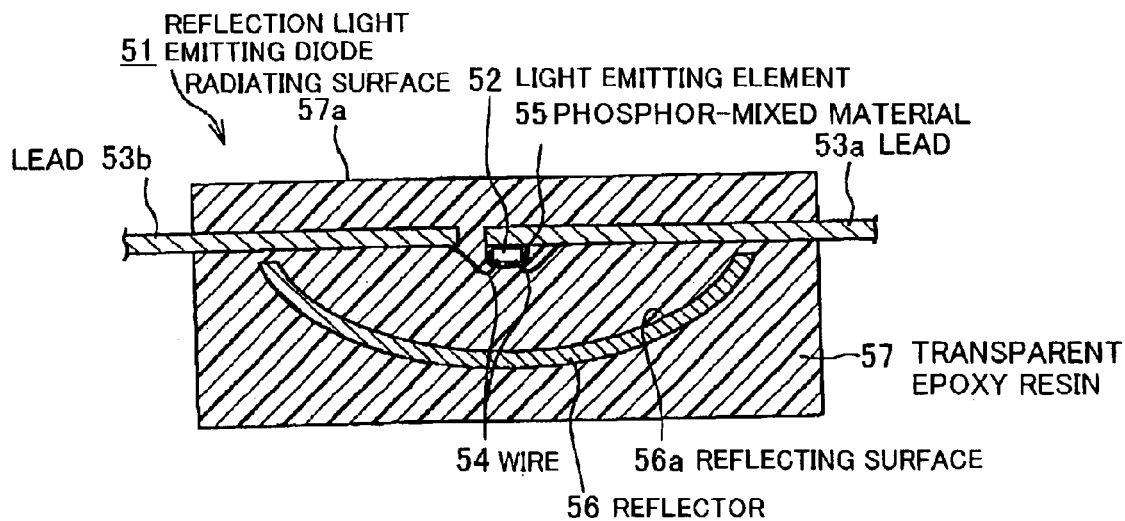
FIG. 9 is a longitudinal sectional view showing the construction of the whole reflection light emitting diode in the third preferred embodiment of the invention.

Next, a reflection light emitting diode using the above light source will be explained. FIG. 9 shows the construction of the whole reflection light emitting diode in the third preferred embodiment of the invention. As shown in FIG. 9, in a reflection light emitting diode 51, the light source part shown in FIG. 8 is turned upside down and is provided. A reflector 56 formed of a highly reflective aluminum sheet is disposed opposite to the light emitting surface (lower surface) of the light emitting element 52 so that a reflecting surface 56*a* of the reflector 56 faces the light emitting element 52. The reflector 56 is in the form of a paraboloid of revolution with the focal point being the light emitting element 52. The reflector 56, together with the light emitting element 52, the wires 54, the phosphor-mixed material 55, and the leading end of the pair of leads 53*a*, 53*b*, have been sealed with a transparent epoxy resin 57 to provide a cylindrical shape.

In the reflection light emitting diode 51 having the above construction, upon emission of light from the light emitting element 52, as described above, the phosphor contained in the phosphor-mixed material 55 is excited to give off yellow fluorescence. In this case, a part of the phosphor-originated yellow light is obtained from the phosphor contained in the mount paste 55*a* interposed between the light emitting element 52 and the lead 53*a*. Therefore, white light having satisfactory brightness can be applied downward and toward the side face. Since the reflector 56 is in the form of a paraboloid of revolution with the focal point being the light emitting element 52, upon the application of the light to the reflector 56, the light is reflected from the reflector 56 upward substantially parallel to the central axis of the paraboloid of revolution and is radiated from the radiating surface 57*a* above the upper surface of the reflection light emitting diode 51.

Figure 10:
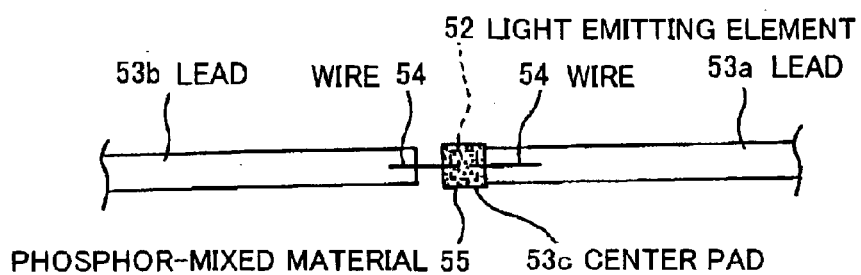
FIG. 10 is a bottom enlarged view showing the light source part of the reflection light emitting diode in the third preferred embodiment of the invention.

As shown in FIG. 10, the pair of leads 53*a*, 53*b* are thin, and a center pad 53*c*, comprising the light emitting element and the phosphor material surrounding the light emitting element, provided at the leading end of the lead 53*a* is approximately one size larger than the light emitting element 52 and has a small area. Therefore, the quantity of the reflected light blocked by the leads and the pad is advantageously small. Thus, the white light reflected from the reflector 56 is mostly radiated to the outside of the light emitting diode. Thus, in the reflection light emitting diode 51, the efficiency of radiating light to the outside of the light emitting diode is high. This efficiency is hereinafter often referred to as "external radiation efficiency."

Figure 11A:
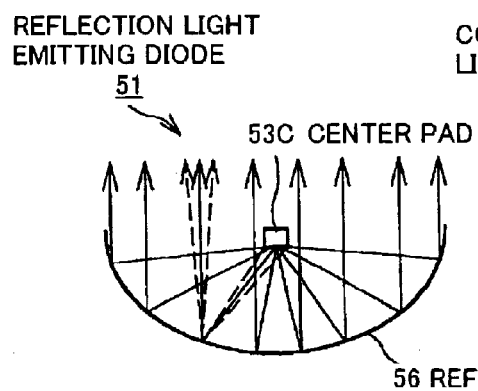
FIG. 11A is a diagram showing an optical path of the reflection light emitting diode in the third preferred embodiment of the invention.
Figure 11B:
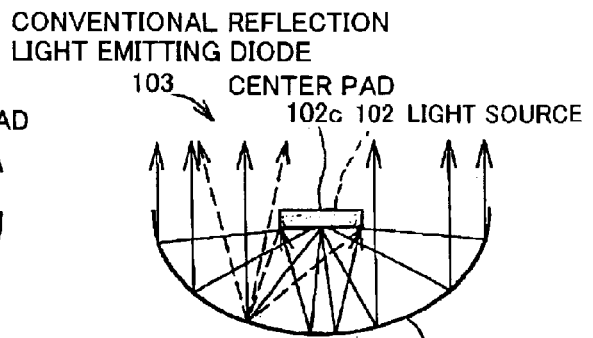
FIG. 11B is a diagram showing an optical path of a conventional reflection light emitting diode.

The influence of the center pad 53*c* and the influence of the size of the light source will be explained in conjunction with FIG. 11A and FIG. 11B. FIG. 11A shows an optical path of the reflection light emitting diode 51 in the third preferred embodiment of the invention, and FIG. 11B shows an optical path of a conventional reflection light emitting diode 103. As shown in FIG. 11B, in the conventional reflection light emitting diode 103, the area of a center pad 102c, comprising a light emitting element and a phosphor-mixed material surrounding the light emitting element, is so large that the proportion of reflected light, which is blocked by the center pad 102c and is not radiated to the outside of the light emitting diode 103, is large. By contrast, in the reflection light emitting diode 51 in the third preferred embodiment shown in FIG. 11A, as described above, the area of the center pad 53c is so small that the proportion of reflected light blocked by the center pad 53c is small and the reflected light is mostly radiated to the outside of the light emitting diode.

Further, as shown in FIG. 11B, in the conventional reflection light emitting diode 103, the size of a light source 102 is large, and the focal point of a reflector 104 in the form of a paraboloid of revolution is the center of the light source 102. Therefore, as the distance of light emission point from the center of the light source 102 increases, the level of deviation of light reflected from the reflector 104 from the direction parallel to the central axis of the paraboloid of revolution increases. For this reason, the deviation level is considerably large at the end of the light source 102, and, consequently, as indicated by a broken line, the spreading of the reflected light beam is large. By contrast, as shown in FIG. 11A, in the reflection light emitting diode 51 in the third preferred embodiment, the size of the light source is substantially equal to the size of the light emitting element, that is, very small. Therefore, the distance between the center of the light source and the end of the light source is small, and the level of deviation of the reflected light from the reflector 56 from the direction parallel to the central axis of the paraboloid of revolution is also small. Consequently, as indicated by a broken line, the spreading of the reflected light beam is small.

Thus, in the reflection light emitting diode 51 in the third preferred embodiment, the size of the center pad for mounting the light source is small. Therefore, light distribution of the radiated beam can be regulated so as for the spreading of the radiated beam to be small, and the external radiation efficiency is large. Thus, an excellent white light source can be provided.

(Fourth Preferred Embodiment)

Figure 12:
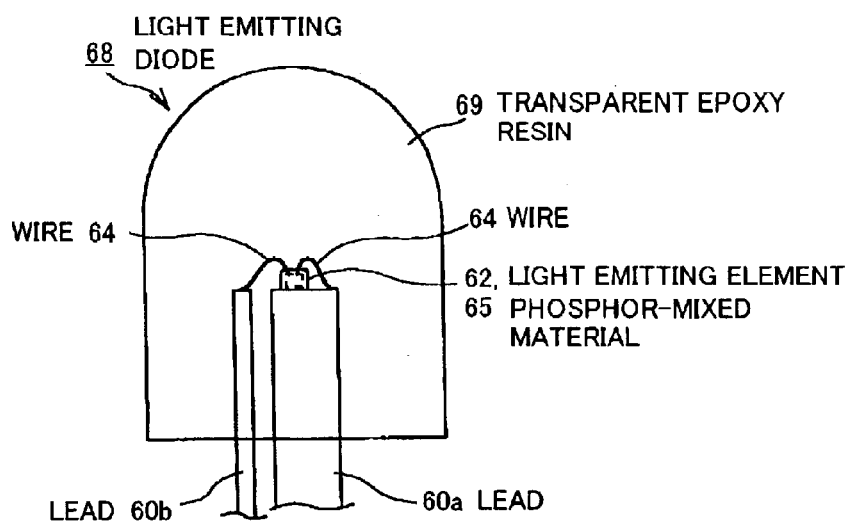
FIG. 12 is a front view showing a lens-type light emitting diode in a fourth preferred embodiment of the invention.

Next, the light emitting diode in the fourth preferred embodiment of the invention will be explained in conjunction with FIG. 12. FIG. 12 shows a lens-type light emitting diode 68 in the fourth preferred embodiment of the invention. As shown in FIG. 12, the lens-type light emitting diode 68 includes a light emitting element 62 and a pair of leads 60a, 60b. The pair of leads 60a, 60b extends vertically from below the light emitting element 62. The light emitting element 62 is mounted on the upper surface of the lead 60a through a phosphor-mixed material 65. The light emitting element 62 is electrically connected to the lead 60a through a wire 64 and is electrically connected to the lead 60b through another wire 64. The phosphor-mixed material 65 is also coated on the upper surface and side surface of the light emitting element 62. The whole assembly has been sealed with a transparent epoxy resin 69 to constitute the lens-type light emitting diode 68. Also in the lens-type light emitting diode 68 having this focusing optical system, the size of the light emitting element 62 and the size of the phosphor-mixed material 65 are small. Therefore, in the lens-type light emitting diode 68, the emitted light can be focused to a small spot, and the light distribution properties are excellent.

(Fifth Preferred Embodiment)

Figure 13:
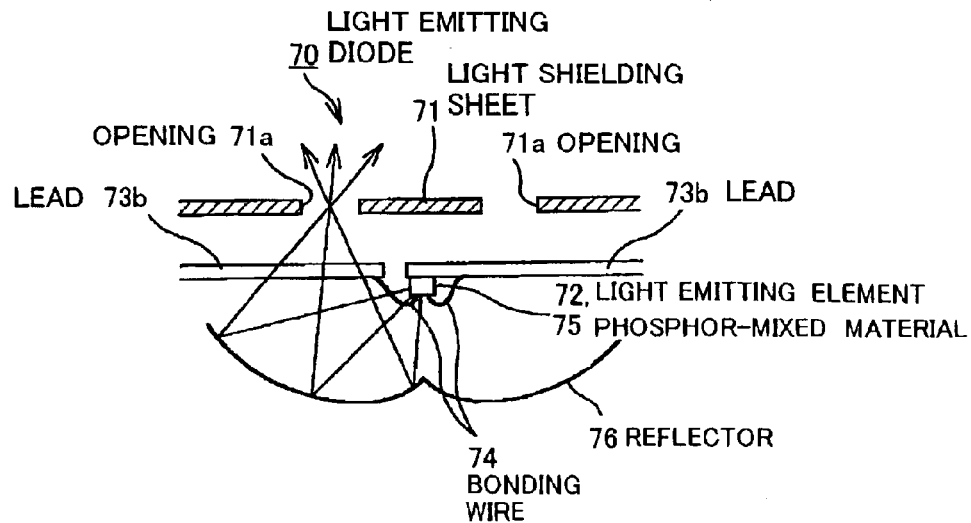
FIG. 13 is a longitudinal sectional view showing a reflection light emitting diode in a fifth preferred embodiment of the invention.

Next, the light emitting diode in the fifth preferred embodiment of the invention will be explained. FIG. 13 shows a light emitting diode 70 in the fifth preferred embodiment of the invention. The light emitting diode 70 is a light-shielding reflective light emitting diode. Specifically, a light-shielding sheet 71 having two openings 71a is disposed in the front face side of the light emitting diode 70. A pair of leads 73a, 73b are provided in the internal side of the light emitting diode 70. A light emitting element 72 is mounted on the lower surface of the leading end of the lead 73a through a phosphor-mixed material 75. The light emitting element 72 is electrically connected to the lead 73a through a wire 74 and is electrically connected to the lead 73b through another wire 74. The phosphor-mixed material 75 is also coated on the upper surface and side surface of the light emitting element 72. A reflector 76, of which the reflecting surface comprises two ellipsoids of revolution provided by rotating a part of each of two ellipses around the central axis, is disposed below a light source including the light emitting element 72 and the phosphor-mixed material 75. The focal point of the reflector 76 is the two openings 71a and the light emitting element 72.

In the light-shielding reflective light emitting diode 70 having the above construction, white light radiated from the light source is reflected from the reflector 76 and is focused in any of the left and right openings 71a. In this case, the size of the light source is so small that the white light is focused to a substantially single point within the opening 71a. Therefore, the size of the opening 71a can be minimized, and, thus, the feature of a light-shielding reflective light emitting diode, that the entry of external light can be prevented, can be fully utilized.

(Sixth Preferred Embodiment)

Figure 14:
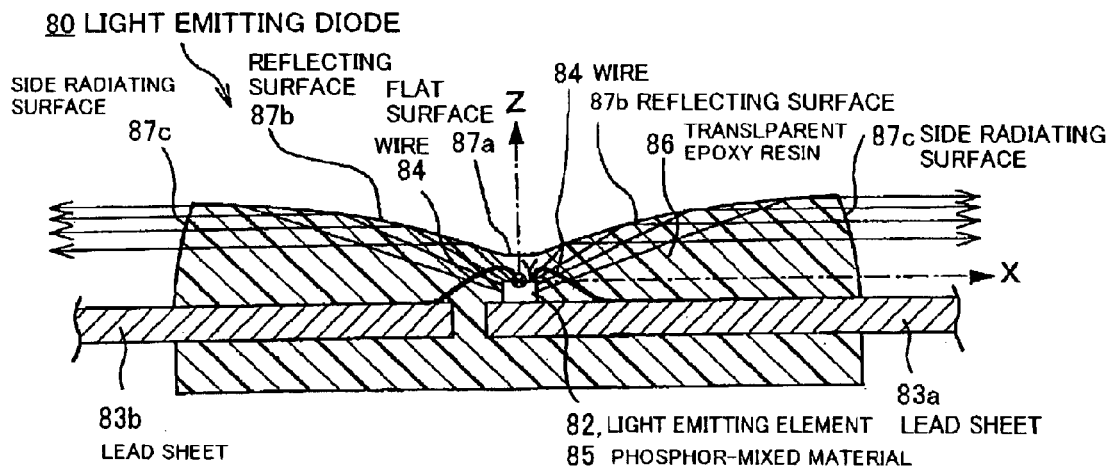
FIG. 14 is a longitudinal sectional view showing a light emitting diode in a sixth preferred embodiment of the invention.

Next, the light emitting diode in the sixth preferred embodiment of the invention will be explained. FIG. 14 shows a light emitting diode 80 in the sixth preferred embodiment of the invention. As shown in FIG. 14, the light emitting diode 80 radiates light radially from a light source toward a reflecting surface 87b and reflects the light from the radiating surface 87b so that the reflected light advances substantially horizontally toward the side surface of the light emitting diode. Here the central axis of the light emitting element 82 is Z axis, and the origin of the central axis is the upper surface of the light emitting element 82. X axis and Y axis intersect each other at a right angle at this origin.

As shown in FIG. 14, in the light emitting diode 80, a pair of lead sheets 83a, 83b are provided on X-Y plane. The area of the lead sheet 83a is larger than that of the lead sheet 83b. A light emitting element 82 is mounted on the leading end of the lead sheet 83a through a phosphor-mixed material 85. The light emitting element 82 is electrically connected to the lead sheet 83a through a wire 84 and is electrically connected to the lead sheet 83b through another wire 84. The phosphor-mixed material 85 is also coated on the upper surface and side surface of the light emitting element 82. The leading end of the lead sheets 83a, 83b, the light emitting element 82, the phosphor-mixed material 85, and the wire 84 have been set in a resin sealing mold and sealed with a transparent epoxy resin 86 to form a resin sealed product having a sectional form as shown in the drawing. A flat surface 87a is provided in the center portion of the upper surface of the light emitting diode 80. A reflecting surface 87b extends from the flat surface 87a in both side directions. The reflecting surface 87b is in the form of an umbrella provided by rotating a part of a parabola (an area of 60 degrees relative to the Z axis), in which the focal point is the center of the light emitting surface of the light emitting element 82 and the axis of symmetry is the X-axis direction, around the Z axis. The light emitting diode 80 has a side radiating surface 87c which constitutes a part of a sphere of which the center is the light emitting element 82.

Specifically, in the light emitting diode 80 in the sixth preferred embodiment, the reflecting surface 87b, which functions to reflect light emitted from a light source including the light emitting element 82 and the phosphor-mixed material 85 toward the side surface without spreading of the light in the upper and lower directions of the light source, and the side radiating surface 87c, which functions to radiate the light reflected toward the side surface to the outside of the light emitting diode 80 without spreading of the light in the upper and lower directions, have been formed by molding using the transparent epoxy resin 86.

Thus, in the light emitting diode 80 in the sixth preferred embodiment, since the light source is small, light is totally reflected in a substantially horizontal direction (a direction parallel to X-Y plane) while substantially avoiding spreading of the light beam in the reflecting surface 87b. Therefore, the light emitting diode 80 in the sixth preferred embodiment can radiate light radially from the light source toward the reflecting surface and can reflect the light from the reflecting surface so as to advance substantially horizontally to the side surface of the light emitting diode 80, that is, so as to radiate flat light to the outside of the light emitting diode 80.

In the above preferred embodiments, a blue light emitting element has been used as a light emitting element. However, the light emitting element is not limited to the blue light emitting element and may be any light emitting element including ultraviolet light emitting elements so far as the light emitting element emits light with a wavelength which can excite the phosphor. That is, the color of light emitted from the light emitting element is not limited to blue and may be any color. Further, in the light emitting diodes in the above preferred embodiments, a transparent epoxy resin has been used as the light transparent material for sealing the light emitting element and the like. Other materials including transparent silicone resins may also be used. Further, for other parts of the light emitting diode, the construction, form, necessary number, material, size, connection relationship and the like are not limited to those in the above preferred embodiments.

The invention has been described in detail with particular reference to preferred embodiments, but it will be understood that variations and modifications can be effected within the scope of the invention as set forth in the appended claims.

What is claimed is:

1. A light emitting diode comprising:
   a base;
   a light emitting element comprising a compound semiconductor provided on the base;
   a mount which is provided between the base and the light emitting element to bond the base to the light emitting element, said mount including a phosphor which absorbs light emitted from the light emitting element and gives off light having a wavelength different from the absorbed light; and
   a phosphor-mixed layer that is provided on a light emitting surface side of the light emitting element and a side surface of the light emitting element and includes a phosphor which absorbs light emitted from the light emitting element and gives off light having a wavelength different from the absorbed light,
   wherein a concentration of the phosphor in the phosphor-mixed layer is lower than a concentration of the phosphor in the mount.

2. The light emitting diode according to claim 1, wherein a reflector is provided on the light emitting surface side of the light emitting element so as to face the light emitting element to reflect the light emitted from the light emitting element before radiation of the light to an outside of the light emitting diode.

3. The light emitting diode according to claim 2, wherein a light shielding sheet comprising at least one opening is provided on the emitted light viewing surface side of the light emitting element as viewed from the base side of the light emitting element.

4. The light emitting diode according to claim 1, wherein the base comprises a pair of leads for supplying electric power to the light emitting element.

5. The light emitting diode according to claim 1, wherein the light emitting element, the mount, and the phosphor-mixed layer are sealed with a light transparent resin which is molded in a lens form as a whole.

6. The light emitting diode according to claim 1, wherein the light emitting element, the mount, and the phosphor-mixed layer are sealed with a light transparent resin which is molded to form a reflecting surface in such a shape that a part of a parabola, of which a focal point includes the light emitting surface of the light emitting element with an axis of symmetry being a horizontal direction, is rotated an a vertical direction.

7. The light emitting diode according to claim 1, wherein the light emitting element comprises a gallium nitride compound semiconductor which emits blue light.

8. The light emitting diode according to claim 1, wherein the phosphor comprises cerium-doped yttrium-aluminum-garnet which absorbs blue light and emits yellow light.

9. A light emitting diode comprising:
   a base;
   a light emitting element comprising a compound semiconductor provided on the base;
   a mount which is provided between the base and the light emitting element to bond the base to the light emitting element, said mount including a phosphor which absorbs light emitted from the light emitting element and gives off light having a wavelength different from the absorbed light; and
   a light-nontransparent conductive layer which is provided in an emitted light viewing surface side of said light emitting element,
   wherein said light-nontransparent conductive layer reflects substantially all light emitted in a direction of said emitted light viewing surface side of said light emitting element from a light emitting layer of the light emitting element toward the mount, and
   wherein said light emitted from said light emitting layer of the light emitting element, in said direction of said emitted light viewing surface side of said light emitting element, is transmitted other than directly above the light emitting element.

10. The light emitting diode according to claim 9, wherein the base comprises a metallic mount lead provided with a reflector for reflecting the light emitted from the light emitting element toward the emitted light viewing surface side.

11. The light emitting diode according to claim 9, wherein the conductive layer comprises a p electrode including at least one of a metal and an alloy of at least two metals selected from a group consisting of rhodium (Rh), gold (Au), platinum (Pt), silver (Ag), copper (Cu), aluminum (Al), nickel (Ni), cobalt (Co), magnesium (Mg), palladium (Pd), vanadium (V), manganese (Mn), bismuth (Bi), tin (Sn), and rhenium (Re).

12. The light emitting diode according to claim 11, wherein the p electrode is wire bonded directly to the base.

13. The light emitting diode according to claim 9, wherein a p electrode is provided on a whole surface of a p-type layer in the light emitting element.

14. The light emitting diode according to claim 9, wherein the light emitting element comprises a gallium nitride compound semiconductor which emits blue light.

15. The light emitting diode according to claim 14, wherein the phosphor comprises cerium-doped yttrium-aluminum-garnet which absorbs blue light and gives off yellow light.

16. The light emitting diode according to claim 9, wherein the light emitting element, the mount, and the conductive layer are sealed with a light transparent resin which is molded in a lens form as a whole.

17. The light emitting diode according to claim 9, wherein the base comprises:
- an insulating board with a lead pattern being formed on the upper and lower sides thereof; and
- a reflector for reflecting the light emitted from the light emitting element toward the emitted light viewing surface side, the reflector being provided on the insulating board so as to surround the light emitting element.

18. The light emitting diode according to claim 17, wherein a light transparent resin for sealing the light emitting element, the mount, and the conductive layer is provided in a space within the reflector.

19. The light emitting diode according to claim 9, wherein the light-non-transparent conductive layer comprises a p electrode including a shape that is substantially equal to a shape of a light emitting layer of the light emitting element such that light emitted from the light emitting element is substantially incident to the mount.

20. The light emitting diode according to claim 9, wherein said light-nontransparent conductive layer comprises at least one of a continuous light-nontransparent conductive layer and a uniform light-nontransparent conductive layer.

21. The light emitting diode according to claim 9, wherein a thickness of said light-nontransparent conductive layer comprises a predetermined thickness that prevents light emitted from said light emitting layer of said light emitting element from transmitting through said light-nontransparent conductive layer.

22. A light emitting diode comprising:

a base;

a light emitting element comprising a compound semiconductor provided on the base:

a mount which is provided between the base and the light emitting element to bond the base to the light emitting element, said mount including a phosphor which absorbs light emitted from the light emitting element and gives off light having a wavelength different from the absorbed light; and a light-nontransparent conductive layer which is provided in an emitted light viewing surface side of said light emitting element, wherein said light-nontransparent conductive layer reflects substantially all light emitted in a direction of said emitted light viewing surface side of said light emitting element from a light emitting layer of the light emitting element toward the mount, and wherein substantially all of said light emitted from said light emitting layer of the light emitting element is emitted in a direction other than said direction of said emitted light viewing surface side of said light emitting element.

23. A light emitting diode comprising:

a base;

a light emitting element comprising a compound semiconductor provided on the base;

a mount which is provided between the base and the light emitting element to bond the base to the light emitting element, said mount including a phosphor which absorbs light emitted from the light emitting element and gives off light having a wavelength different from the absorbed light; and a light-nontransparent conductive layer which is provided in an emitted light viewing surface side of said light emitting element, wherein said light-nontransparent conductive layer reflects substantially all light emitted in a direction of said emitted light viewing surface side of said light emitting element from a light emitting layer of the light emitting element toward the mount, and wherein said light emitted from said light emitting layer of the light emitting element is emitted other than directly from said light emitting element in said direction of said emitted light viewing surface side of said light emitting element.

24. A light emitting diode comprising:

a base;

a light emitting element comprising a compound semiconductor provided on the base;

a mount which is provided between the base and the light emitting element to bond the base to the light emitting element, said mount including a phosphor which absorbs light emitted from the light emitting element and lives off light having a wavelength different from the absorbed light; and a light-nontransparent conductive layer which is provided in an emitted light viewing surface side of said light emitting element, wherein said light-nontransparent conductive layer reflects substantially all light emitted in a direction of said emitted light viewing surface side of said light emitting element from a light emitting layer of the light emitting element toward the mount, and wherein light emitted from said light emitting layer is reflected downward by an entire back face of said light-nontransparent conductive layer.

* * * * *